US007056815B1

(12) United States Patent
Weng et al.

(10) Patent No.: US 7,056,815 B1
(45) Date of Patent: Jun. 6, 2006

(54) NARROW ENERGY BAND GAP GALLIUM ARSENIDE NITRIDE SEMI-CONDUCTORS AND AN ION-CUT-SYNTHESIS METHOD FOR PRODUCING THE SAME

(75) Inventors: Xiaojun Weng, Ann Arbor, MI (US); Rachel S. Goldman, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 142 days.

(21) Appl. No.: 10/706,737

(22) Filed: Nov. 12, 2003

Related U.S. Application Data

(60) Provisional application No. 60/425,388, filed on Nov. 12, 2002.

(51) Int. Cl.
*H01L 21/265* (2006.01)
*H01L 31/00* (2006.01)

(52) U.S. Cl. ...................... 438/518; 438/522; 438/530; 257/441; 257/102

(58) Field of Classification Search ................ 438/455, 438/456, 458, 464, 514, 518, 522, 530, 766; 257/102, 200, 201, 441, 442
See application file for complete search history.

(56) References Cited

U.S. PATENT DOCUMENTS

| | | | | |
|---|---|---|---|---|
| 5,993,677 | A * | 11/1999 | Biasse et al. | 438/458 |
| 6,048,411 | A * | 4/2000 | Henley et al. | 148/33.5 |
| 6,225,192 | B1 * | 5/2001 | Aspar et al. | 438/460 |
| 6,656,271 | B1 * | 12/2003 | Yonehara et al. | 117/94 |

OTHER PUBLICATIONS

44th Electronic Materials Conference Oral presentation entitled "Ion-Cut-Synthesis of Narrow Gap Nitride Nanostructures" by X. Weng, et al. dated Jun., 2002.
2002 Spring Meeting of the Materials Research Society, Oral presentation entitled "Ion-Cut-Synthesis of Narrow Gap Nitride Alloys" by X. Weng, et al., dated Apr., 2002.
Journal of Vacuum Science and Technology B, publication entitled "Formation and Blistering of GaAsN Nanostructure Layers", by X. Weng, et al. dated May-Jun., 2004 issue.

* cited by examiner

*Primary Examiner*—Kevin M. Picardat
(74) *Attorney, Agent, or Firm*—Rader, Fishman & Graue, PLLC

(57) ABSTRACT

A method for forming a semi-conductor material is provided that comprises forming a donor substrate constructed of GaAs, providing a receiver substrate, implanting nitrogen into the donor substrate to form an implanted layer comprising GaAs and nitrogen. The implanted layer is bonded to the receiver substrate and annealed to form GaAsN and nitrogen micro-blisters in the implanted layer. The micro-blisters allow the implanted layer to be cleaved from the donor substrate.

22 Claims, 6 Drawing Sheets

Annealing

New Wafer

GaAs Thin Film 14 10 12b 12c 12a 15

NARROW ENERGY BAND GAP GALLIUM ARSENIDE NITRIDE SEMI-CONDUCTORS AND AN ION-CUT-SYNTHESIS METHOD FOR PRODUCING THE SAME

CROSS REFERENCE TO RELATED APPLICATION

This application claims priority based on U.S. Provisional Patent Application No. 60/425,388, filed Nov. 12, 2002, which is hereby incorporated by reference in full.

STATEMENT REGARDING FEDERALLY SPONSORED RESEARCH OR DEVELOPMENT

This invention was made with government support of grant #ACQ-1-30619-14 from National Renewable Energy Laboratory and grant #F49620-00-1-0328 from Air Force Office of Scientific Research. The government has certain rights in the invention.

FIELD OF THE INVENTION

The present invention generally relates to a gallium arsenide based semi-conductor material, and more particularly, the present invention relates to a gallium arsenide nitride semi-conductor with a narrow energy band gap.

BACKGROUND OF THE INVENTION

Gallium alloys have been shown to exhibit a reduced energy band gap that fluctuates as a function of the amount of arsenide and nitride added thereto. For example, 1% atomic nitrogen added to gallium arsenide (GaAs) to form gallium arsenide nitride (GaAsN) has been shown to reduce the energy band gap by as much as 200 meV. Likewise, the introduction of 1% arsenic into gallium nitride (GaN) to form GaAsN has been shown to reduce the band gap by as much as 700 meV. The resulting material is applicable and useful in a wide range of semi-conductor applications. Specifically, narrow energy band gap semi-conductors constructed with such alloys are useful in long wave length light emitters and detectors, high performance electronic devices, and high efficiency solar cells.

Many conventional methods of GaAsN formation in the semi-conductor industry involve an epitaxial or other similar growth process, molecular beam epitaxy (MBE), gas-source MBE (GS-MBE), metalorganic chemical vapor deposition (MOCVD) and sputtering. While these methods do result in the formation of GaAsN material applicable for semi-conductor usage, growth processes place a solubility limit on the amounts of nitrogen that can be contained within the resulting GaAsN material.

Other methods, such as that disclosed in the article entitled, "High Concentration Nitrogen Ion Doping Into GaAs For The Fabrication Of GaAsN," reported in the publication *Nuclear Instruments And Methods In Physics Research* B 118 (1996) 743–747, discloses other methods of doping GaAs with nitrogen, which do achieve better solubility of nitrogen into the GaAs material. Specifically, nitrogen ions are implanted into a LEC formed GaAs substrate by high energy (400 keV) ion implantation. This process is then followed by an annealing process.

While this approach provides a means for doping GaAs with nitrogen, there is a desire to improve manufacturing methods of forming such substrates. Such desire is to conserve material and decrease the size of the GaAsN layer, as well as the underlying substrate to only the size that is needed for an application.

SUMMARY OF THE INVENTION

The present invention provides a Nitrogen implanted Gallium material with improved optical and luminescent characteristics, and an ion-cut-synthesis method to accomplish the same.

Other aspects of the invention will be apparent to those skilled in the art after reviewing the drawings and the detailed description below.

BRIEF DESCRIPTION OF THE DRAWINGS

The present invention will now be described, by way of example, with reference to the accompanying drawings, in which.

DETAILED DESCRIPTION OF THE EMBODIMENTS

The present invention improves the methods for forming GaAsN substrates by providing a means for creating a GaAsN layer that includes ion implantation into a different GaAs substrate, than that which is to be used for the resulting low energy band gap application. This implantation causes a GaAsN layer to be formed to a depth in the GaAs substrate based on implanting characteristics of the implantation process. The implantation also forms microbubbles that separate the GaAsN layer from the remainder of the GaAs substrate. The GaAs substrate can then be attached to another substrate for use in a reduced energy band gap application. By this way, only a minimum needed layer can be created in the GaAs substrate, leaving the remainder of the substrate for other uses. The receiver substrate can also be specifically sized for the desired application as the exact depth of the GaAsN layer is known.

Figure 1:
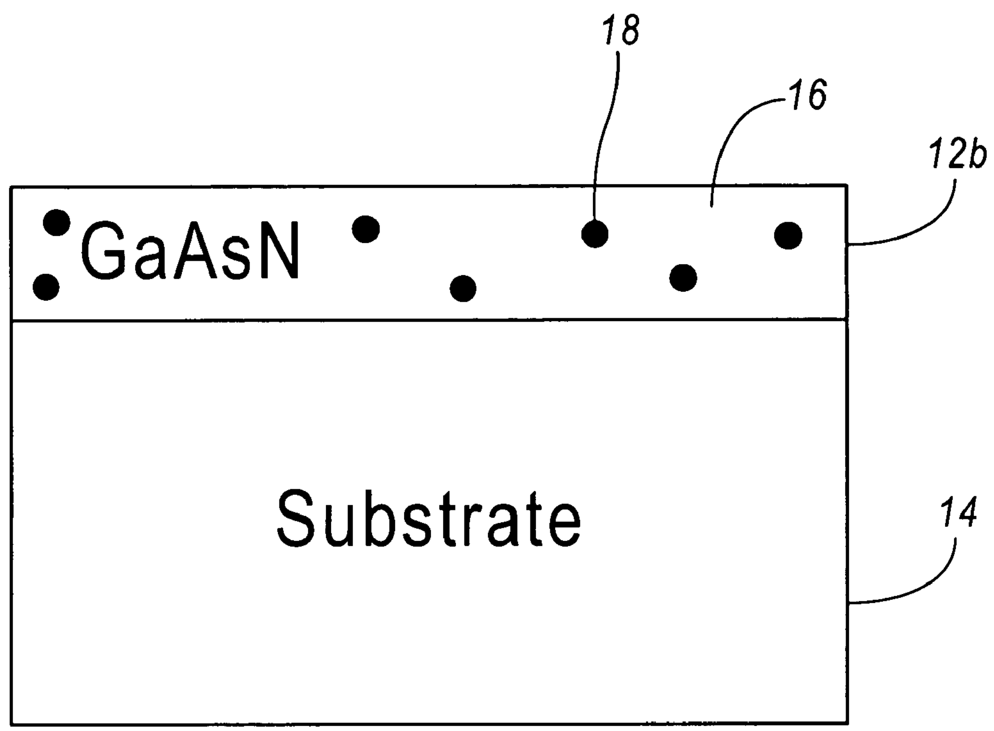
FIG. 1 is a schematic view illustration of a semi-conductor material according to the present invention.

Referring now to FIG. 1, a semi-conductor material 10 is shown as having a thin film 12*b* including a GaAs matrix 16 and GaAsN nanostructures 18 positioned therein. Thin film 12*b* is disposed on substrate 14 that is composed of a base material such as GaAs, silicon or other suitable material. Thin film 12*b* is preferably initially 0.15 μm in thickness. However, it is noted that other thicknesses are possible, and that the present invention is not limited to that disclosed herein.

Figure 2A:
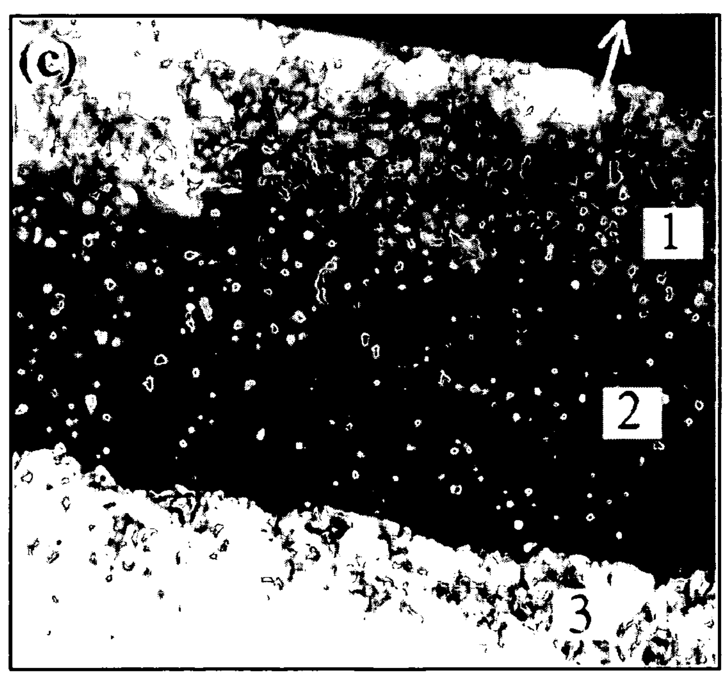
FIG. 2*a* is a TEM picture of semi-conductor material according to the present invention.
Figure 2B:
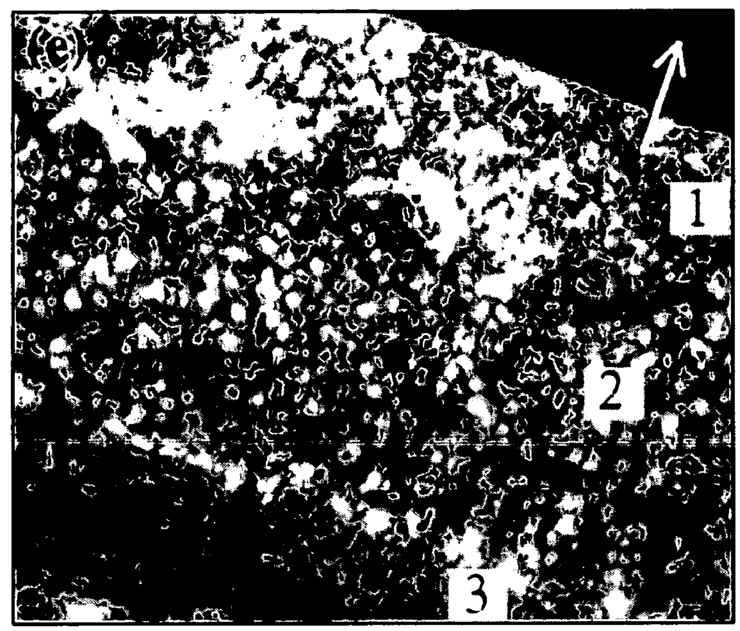
FIG. 2*b* is a TEM picture of semi-conductor material according to the present invention.
Figure 2C:
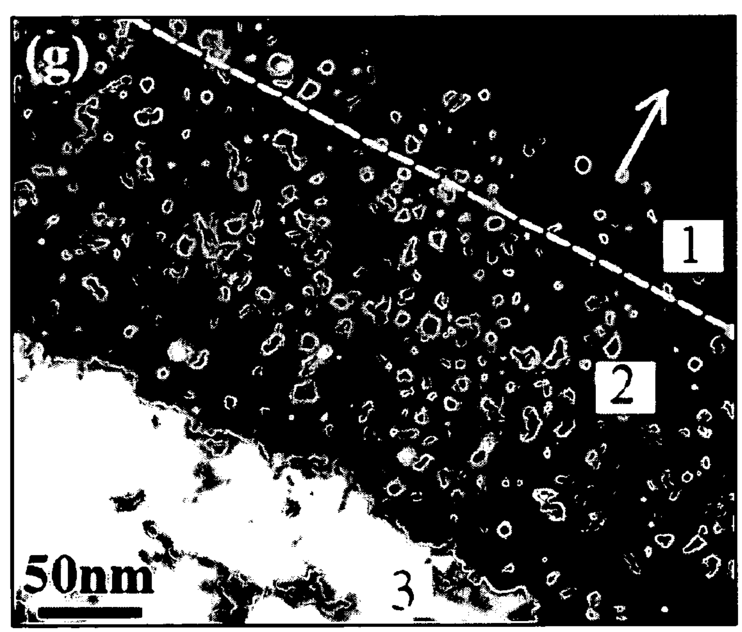
FIG. 2*c* is a TEM picture of semi-conductor material according to the present invention.

FIG. 2 shows dark-field diffraction contrast TEM images of 750 (FIG. 2*a*), 800 (FIG. 2*b*) and 850° C. (FIG. 2C) annealed samples of thin film 12*b*. It should be noted that the images of thin film 12*b* as shown in FIG. 2 are attached to substrate 15 (See FIG. 4). However, for purposes of description, the structure of thin film 12*b* as described with reference to FIG. 2, is applicable to the thin film 12*b* of both FIGS. 1 and 4. The ion-cut-synthesis method used to effectuate the transfer of thin film 12*b* from substrate 15 to substrate 14, will be described in greater detail in the following sections.

In FIG. 2, three regions are shown including a surface layer 1, a 150-nm-thick middle layer 2, and a near-substrate layer 3. It is noted that although specific dimensions are shown and described, other variations to the depth and composition of the layers are possible dependent upon the nitrogen implantation and annealing characteristics as described hereinafter. For the thin film 12*b* shown in FIGS. 2*a*, 2*b*, and 2*c*, the middle layers preferably contain 2–10 nm sized GaAsN nanocrystallites in an amorphous GaAs matrix.

Figure 3:
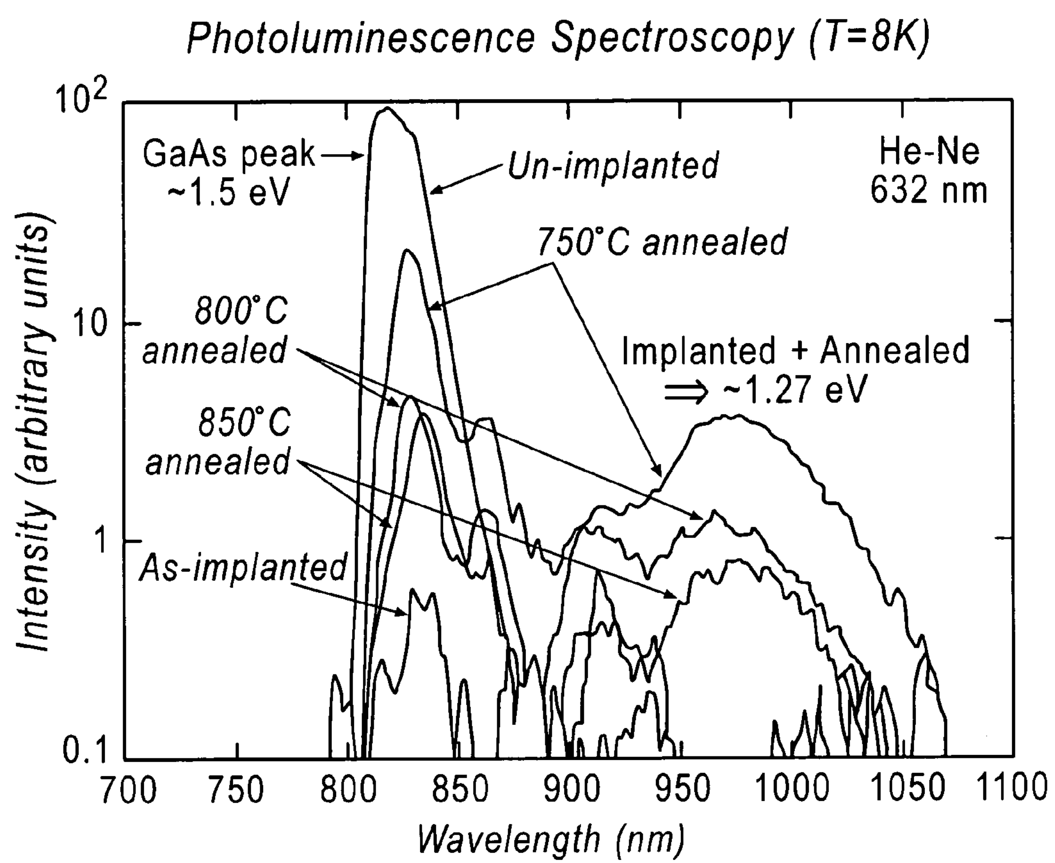
FIG. 3 is a graphical view illustration of a photoluminescence data from semi-conductor material according to the present invention.

Referring now to FIG. 3, a photoluminescence spectroscopy plot is provided depicting the intensity and wavelength optical properties of thin film 12*b* as shown and described. The intensity is in arbitrary units while the wave length is in nanometers. The un-implanted state illustrates the wavelength and photoluminescence scenario where a GaAs material is not combined with nitrogen. Here, it can be seen that the photoluminescence has a high intensity between wavelengths of about 800 to 850 nm. When nitrogen is implanted and the thin film is annealed at temperatures of 750° C., 800° C. and 850° C., respectively, it can be seen that a photoluminescence intensity increase is achieved between the wavelengths of about 900 and 1050 nm.

Figure 4A:
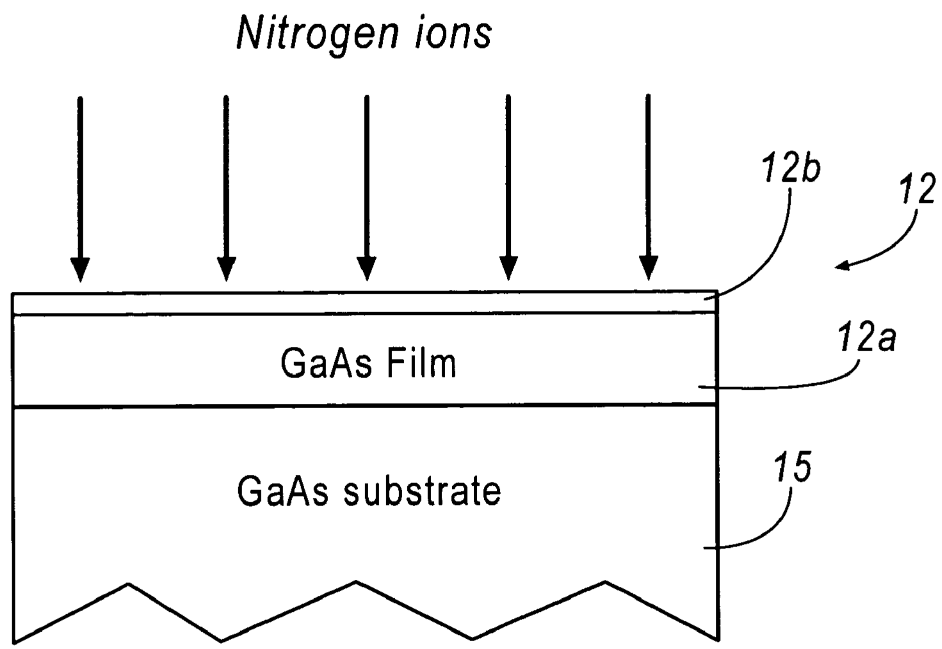
FIG. 4*a* is a schematic view illustration of a manufacture of semi-conductor material according to the present invention.

Referring now to FIGS. 4*a*–4*d*, an ion-cut-synthesis method for preparing the semi-conductor material according to the present invention is shown and described. In FIG. 4*a*, a GaAs substrate 15 is grown by VGF or other suitable methods and similar techniques. A base film 12 is then grown thereon by molecular beam epitaxy or other similar techniques such as MOCVD or GS-MBE. Preferably, the GaAs base film 12 is grown to a depth of 1.5 μm above the upper surface of the substrate 15 and formed as a uniform and stoichiometric matrix.

Figure 5:
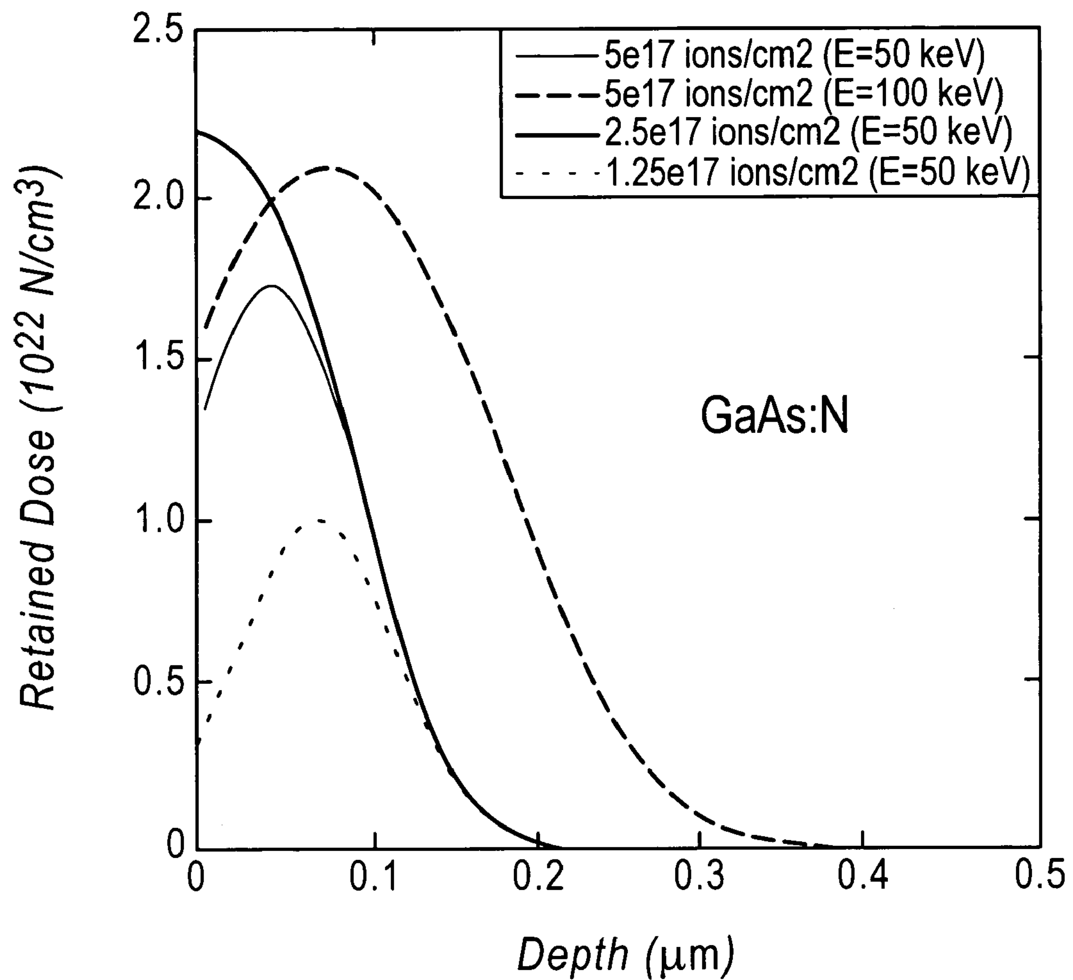
FIG. 5 is a plot of a simulation of a retained dosage of nitrogen and penetration depth of semi-conductor material according to the present invention.

With continued reference to FIG. 4*a*, nitrogen ions are implanted into the thin film 12 by a high energy ion implantation method. In the preferred embodiment of the present invention, the nitrogen is implanted in base layer 12 by maintaining the base film 12 at a temperature of 300° C. and implanting nitrogen at a concentration of $5\times10^{17}$ $cm^2$ by a high energy (100 keV) ion implantation. The retained dose from this implantation is preferably about $1.7\times10^{22}$ $N/cm^3$ at a depth of 0.15 μm into the base film 12. However, as will be understood by one skilled in the art from reviewing FIG. 5, modifications and variations of this retained dosage and implantation depth can be obtained. In the preferred embodiment of the present invention, it is desirable to obtain both a sufficient depth, as well as a high retained dosage of nitrogen in the base film 12 to form the thin film 12*b*. As can be seen, the implantation depth of the nitrogen ions preferably falls far short of the depth of the grown thin film 12*b* to allow reusability of the base film 12 for forming multiple thin films 12*b*. As a result, only the upper portion of the base film 12 is used for formation of thin film 12*b*.

Figure 4B:
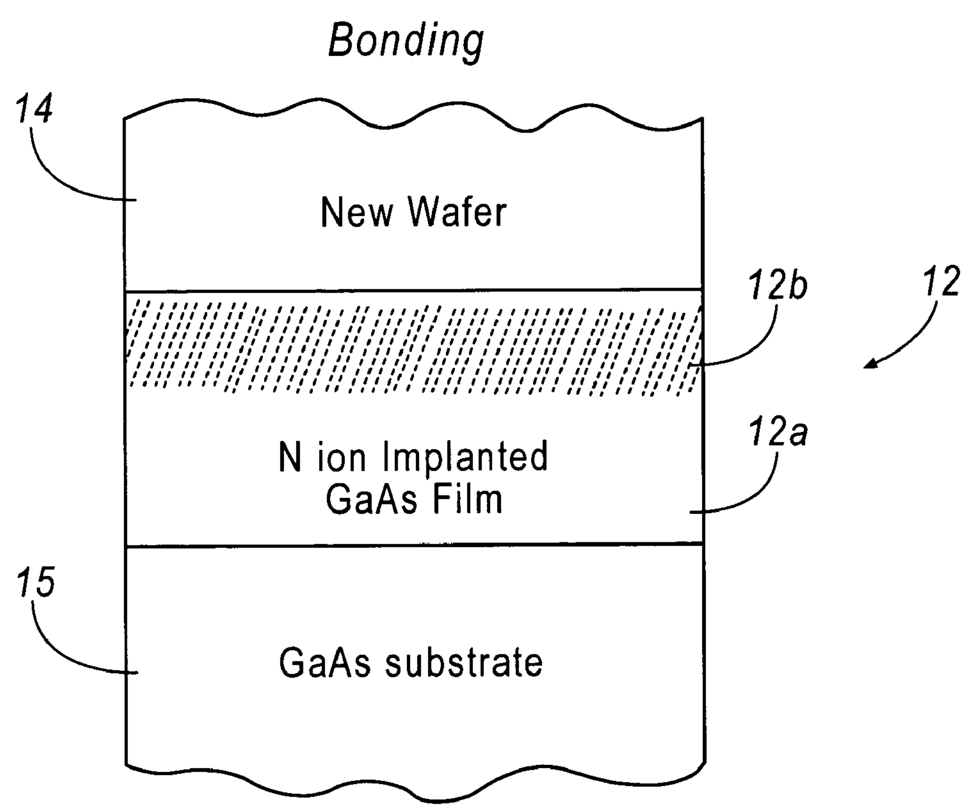
FIG. 4*b* is a schematic view illustration of a manufacture of semi-conductor material according to the present invention.
Figure 4C:
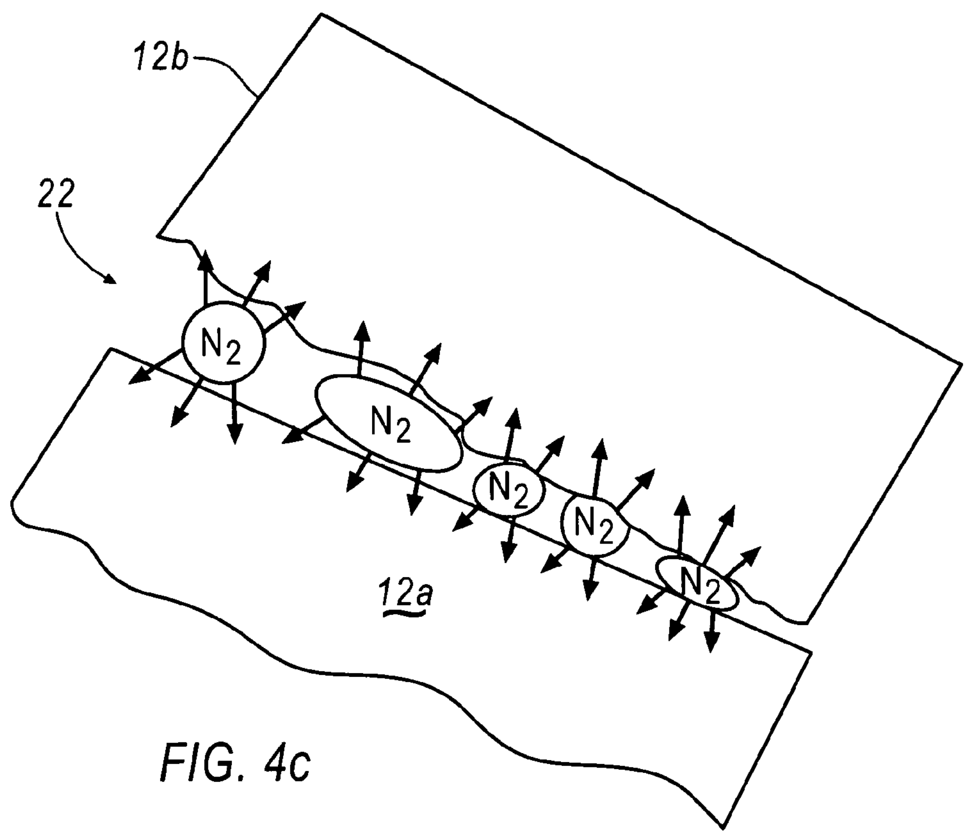
FIG. 4*c* is a schematic view illustration of a manufacture of semi-conductor material according to the present invention.
Figure 4D:
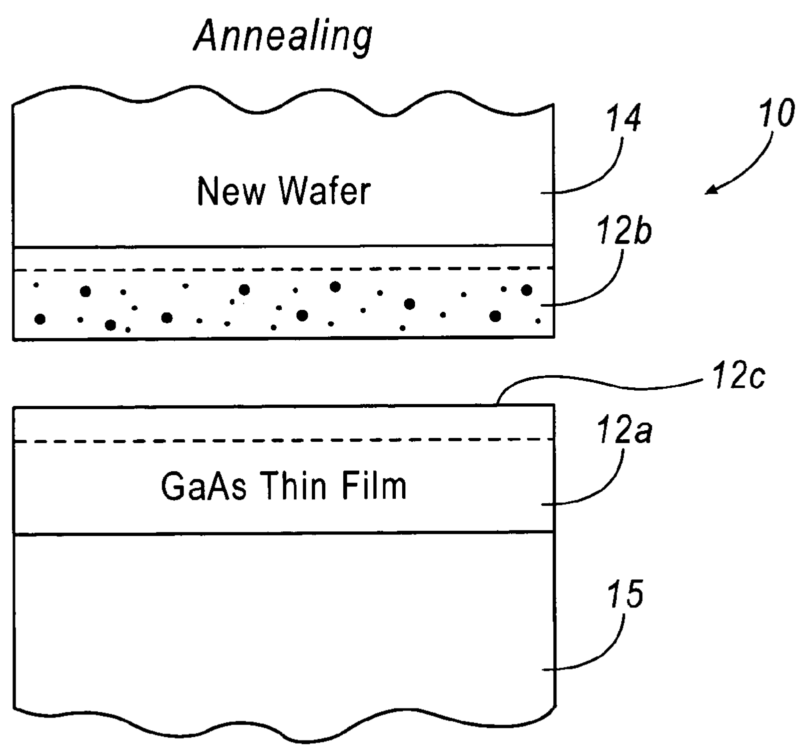
FIG. 4*d* is a schematic view illustration of a manufacture of semi-conductor material according to the present invention.

Referring now to FIG. 4*b*, implanted portion 12*b* is affixed to substrate 14 by wafer bonding technology. Substrate 14 can be GaAs, silicon, or other suitable material. As shown in FIG. 4*c*, substrate 14, thin film 12*b* and substrate 15 are then annealed at a temperature between 750 and 850° C., as described in FIG. 4. The time for annealing is preferably 30 seconds. The annealing process results in the formation of the GaAsN nanostructures 18 (see FIG. 1) to create the desired photoluminescence at longer wavelengths as described with reference to FIG. 3. Additionally, the annealing process causes the formation of nitrogen microbubbles 22 that causes separation of the thin film 12*b* from the remainder of base layer 12 or unimplanted portion 12*a*. The microblister formation occurs at the preferred implantation depth of 0.15 μm and thereby causes cleavage of the implanted portion 12*b* from the unimplanted portion 12*a*. Referring to FIG. 4*d*, the implanted portion 12*b* containing GaAsN is cleaved from unimplanted portion 12*a*, thereby leaving a damaged layer 12*c*. Implanted portion 12*b* is then polished, as known to one skilled in the art, to create a resulting semi-conductor material 15 that includes substrate 14 and implanted GaAsN portion 12*b*. The material is then used in known semi-conductor manufacturing processes to form the desired components which include, but are not limited to, long wave length light emitters and detectors, high performance electronic devices, and high efficiency solar cells. As the implantation depth includes only a small upper portion of thin film 12, the damage layer 12*c* can be removed by polishing to leave the remaining unimplanted portion 12*a*. As only the upper layer of base film 12 is used, the remaining portion 12*a* can then be used to form additional thin films 12*b* for further applications.

While the present invention has been particularly shown and described with reference to the foregoing preferred and alternative embodiments, it should be understood by those skilled in the art that various alternatives to the embodiments of the invention described herein may be employed in practicing the invention without departing from the spirit and scope of the invention as defined in the following claims. It is intended that the following claims define the scope of the invention and that the method and apparatus within the scope of these claims and their equivalents be covered thereby. This description of the invention should be understood to include all novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements.

What is claimed is:

1. A method for forming a semi-conductor material, comprising:

forming a donor substrate constructed of GaAs;

providing a receiver substrate;

implanting nitrogen into the donor substrate to form an implanted layer comprising GaAs and nitrogen;

bonding the implanted layer to the receiver substrate;

annealing the implanted layer to form GaAsN nanostructures and nitrogen micro-blisters in the implanted layer; and cleaving the implanted layer from the donor substrate.

2. The method according to claim 1, wherein the implanting step comprises implanting the nitrogen with a high energy ion implantation method.

3. The method according to claim 2, wherein the implanting step comprises maintaining the implanted layer at a temperature of about 300° C. and implanting nitrogen at a concentration of about $5\times10^{17}$ $cm^{-2.}$

4. The method according to claim 1, wherein the step of annealing further comprises heating the implanted layer to a temperature of about between 750 and 850° C. for a time of about 30 seconds.

5. The method according to claim 1, wherein a retained dose from the implantation of nitrogen in the implanted layer is about $1.7\times10^{22}$ $N/cm^3$.

6. The method according to claim 1, wherein a thickness of the implanted layer is about 0.15 μm.

7. The method according to claim 1, wherein the step of forming the donor substrate comprises:

forming a GaAs layer; and forming an epitaxial GaAs layer by an epitaxial method on the GaAs layer.

8. The method according to claim 7, wherein the nitrogen is implanted into the epitaxial GaAs layer to form the implanted layer in the implanting step.

9. The method according to claim 8, wherein the epitaxial GaAs layer is thicker than the implanted layer.

10. The method according to claim 1, further comprising polishing a cleaved area of the implanted layer after the cleaving step.

11. The method according to claim 1, wherein the semi-conductor material is used in a long wave length light emitter or detector, high performance electronic device, or a high efficiency solar cell.

12. The method according to claim 1, wherein the receiver substrate is formed of GaAs.

13. The method according to claim 1; wherein the GaAsN are micro-structures sized 2–10 nm.

14. The method according to claim 1, further comprising:

providing a second receiver substrate;

implanting nitrogen into a remainder of the donor substrate to form a second implanted layer after the cleaving step, wherein the second implanted layer comprises GaAs and nitrogen;

bonding the second implanted layer to the second receiver substrate;

annealing the second implanted layer to form GaAsN and nitrogen micro-blisters in the second implanted layer; and cleaving the second implanted layer from the donor substrate.

15. A narrow energy band gap semi-conductor constructed according to the method of claim 1.

16. A long wave length light emitter constructed according to the method of claim 1.

17. A long wave light detector constructed according to the method of claim 1.

18. A high performance electronic device constructed according to the method of claim 1.

19. A semi-conductor material, comprising:

a donor substrate constructed of GaAs;

an epitaxial GaAs layer disposed on one side of the donor substrate; and an implanted layer comprising GaAs and nitrogen disposed in the epitaxial GaAs layer.

20. The semi-conductor material according to claim 19, further comprising a receiver substrate bonded to the implanted layer.

21. The semi-conductor material according to claim 19, wherein a dose of nitrogen in the implanted layer is about $1.7\times10^{22}$ $N/cm^3$.

22. The semi-conductor material according to claim 19, wherein a thickness of the implanted layer is about 0.15 μm.

* * * * *